United States Patent [19]

Mathew

[11] Patent Number: 5,728,285
[45] Date of Patent: Mar. 17, 1998

[54] PROTECTIVE COATING COMBINATION FOR LEAD FRAMES

[75] Inventor: Ranjan J. Mathew, San Jose, Calif.

[73] Assignee: National Semiconductor Corporation, Santa Clara, Calif.

[21] Appl. No.: 829,253

[22] Filed: Mar. 31, 1997

Related U.S. Application Data

[62] Division of Ser. No. 513,690, Aug. 11, 1995, abandoned, which is a division of Ser. No. 429,670, Apr. 27, 1995, Pat. No. 5,650,661, which is a continuation-in-part of Ser. No. 174,890, Dec. 27, 1993, Pat. No. 5,436,082.

[51] Int. Cl.$^6$ .................. C25D 5/10; H01L 23/495
[52] U.S. Cl. .................. 205/182; 205/122; 205/176
[58] Field of Search .................. 205/122, 123, 205/128, 129, 138, 145, 170, 176, 182

[56] References Cited

U.S. PATENT DOCUMENTS

| | | | |
|---|---|---|---|
| 3,648,355 | 3/1972 | Shida et al. | 29/41.7 |
| 4,141,029 | 2/1979 | Dromsky | 357/70 |
| 4,404,080 | 9/1983 | Jahani | 204/224 R |
| 4,405,432 | 9/1983 | Kosowsky | 204/206 |
| 4,441,118 | 4/1984 | Fister et al. | 357/70 |
| 4,486,511 | 12/1984 | Chen et al. | 428/620 |
| 4,529,667 | 7/1985 | Shiga et al. | 428/646 |
| 4,628,165 | 12/1986 | Nobel et al. | 200/268 |
| 4,888,449 | 12/1989 | Crane et al. | 174/524 |
| 4,894,752 | 1/1990 | Murata et al. | 361/421 |
| 5,001,546 | 3/1991 | Butt | 357/71 |
| 5,138,431 | 8/1992 | Huang et al. | 357/71 |
| 5,221,859 | 6/1993 | Kobayashi et al. | 257/676 |
| 5,360,991 | 11/1994 | Abys et al. | 257/666 |
| 5,454,929 | 10/1995 | Kinghorn | 205/128 |
| 5,486,721 | 1/1996 | Herklotz et al. | 257/748 |

FOREIGN PATENT DOCUMENTS

| | | |
|---|---|---|
| 0 250 146 | 12/1987 | European Pat. Off. . |
| 0 335 608 | 10/1989 | European Pat. Off. . |
| 0 384 586 | 8/1990 | European Pat. Off. . |
| 0 538 019 A2 | 4/1993 | European Pat. Off. . |
| 6-0228-695-A | 11/1985 | Japan . |
| 1-257-356-A | 10/1989 | Japan . |
| 4312937 | 11/1992 | Japan . |
| 5090465 | 4/1993 | Japan . |

OTHER PUBLICATIONS

Donald C. Abbott et al., Palladium as a Lead Finish for Surface Mount Integrated Circuit Packages; Texas Instruments Incorporated, Dallas, Texas, frm IEPC Proceedings, Sep. 1990, pp. 110–119.

*Primary Examiner*—Kathryn L. Gorgos
*Assistant Examiner*—William T. Leader
*Attorney, Agent, or Firm*—Limbach & Limbach L.L.P.

[57] ABSTRACT

A lead frame for a semiconductor device includes a base which is coated by a protective coating. The lead frame base is made of a ferrous material. The protective coating is made by sequentially electroplating a copper-containing layer, a silver-containing layer and a palladium-containing layer. Protective coatings constructed in this way are bondable, solderable, oxidation resistant, corrosion resistant, free of lead (Pb), resistant to high temperatures, cost effective, and cosmetically acceptable. It is also possible to use a layer of tin or a tin alloy in place of the silver layer.

1 Claim, 2 Drawing Sheets

PROTECTIVE COATING COMBINATION FOR LEAD FRAMES

This is a divisional of application Ser. No. 08/513,690, filed Aug. 11, 1995, now abandoned, which is a divisional application of application Ser. No. 08/429,670 filed on Apr. 27, 1995, now U.S. Pat. No. 5,650,661, which is a continuation-in-part application of application Ser. No. 08/174,890 filed on Dec. 27, 1993, now U.S. Pat. No. 5,436,082.

BACKGROUND OF THE INVENTION

1. Field of the Invention

The present invention relates to the construction of lead frames for semiconductor devices.

2. Background Art

Copper lead frames are employed extensively in semiconductor device packages primarily due to their high thermal conductivity. Often, the lead frame is preplated with a suitable coating metal prior to encapsulation because the coating significantly reduces the number of assembly steps typically required for post-assembly coating processes. The preplate coating protects the exposed lead frame, and promotes wire bonding and solderability of the leads after encapsulation.

Optimal lead frame coatings should be free of lead (Pb), corrosion resistant, oxidation resistant, resistant to high temperatures (over 200° C.), wire-bondable, and solderable after assembly and burn-in processes. Additionally, the coating should be cost effective and cosmetically acceptable.

The prior art discloses lead frame coatings in which the outermost coating layers comprise nickel and palladium. However, lead frames are required to possess a relatively high solderability coverage as measured by standard solderability tests. In some cases, it has been found that such preplated leads are not as solderable as might be desired.

Thus, there is a need for a lead frame structure which is readily solderable, while still exhibiting the desirable characteristics described above.

SUMMARY OF THE INVENTION

It is an object of the present invention to provide a preplated copper lead frame coating that produces a finish that is readily bondable, solderable, free of lead, corrosion resistant and cosmetically acceptable. It is a further object of the invention to provide a preplated palladium lead frame coating finish that is undercoated with silver and copper in order to improve solderability.

In accordance with the present invention a copper lead frame is first coated with nickel using methods well known in the art. Then a thin layer of copper in the form of a strike coating is applied over the nickel. Next, a layer of silver is applied to the copper coating. A palladium finish coat is then applied over the silver. The silver layer acts to promote solderability of the lead frame. The copper layer promotes adherence between the silver layer and the nickel layer, improves solderability, and enhances tarnish resistance.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
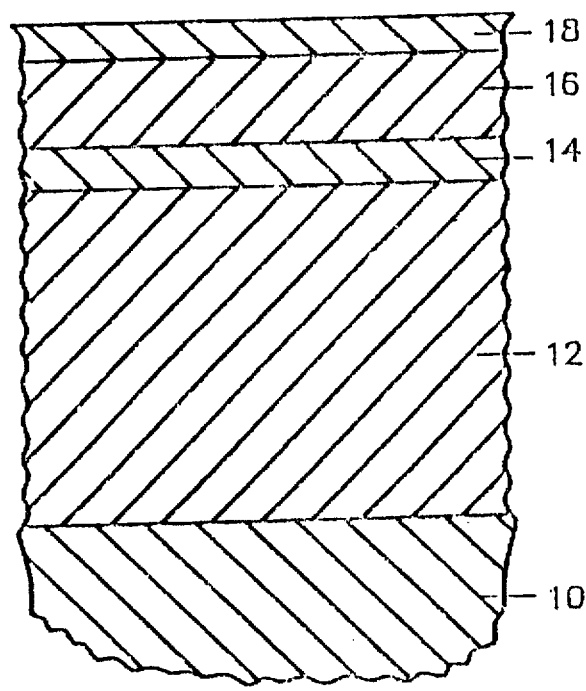
FIG. 1 is a cross-sectional view (not to scale) illustrating a fragment of an embodiment of a lead frame according to the present invention.

Referring to a preferred embodiment of the invention shown in FIG. 1, the base layer 10 of the lead frame is made of any suitable lead frame base material, for example copper or a copper alloy. Two examples of acceptable alloys are sold under the names Olin Alloy C-7025 and Olin Alloy 194, by Olin Brass of East Alton, Ill. One advantage of a copper base metal layer is high thermal conductivity.

The base metal layer 10 is coated with a nickel layer 12. One method of applying the nickel layer 12 is by electrolytic deposition, a technique which is well-known in the art. The thickness of nickel layer 12 should be between 1.25 and 2.50 microns, preferably about 1.5 microns.

A copper layer 14 is applied over the nickel layer 12 by electrolytic deposition. The copper layer 14 is made of either pure copper or a copper alloy, pure copper being preferred. Cu-Sn and Cu-Ag are two examples of copper alloys which exhibit sufficient solderability such that these alloys could be expected to work effectively as copper layer 14 in embodiments of the present invention. The thickness of the copper layer 14 should be between 0.08 and 0.38 microns, preferably about 0.25 microns. One benefit of the copper layer 14 is improved solderability of the finished lead frame. The copper layer 14 also seems to enhance tarnish resistance of the lead frame coating.

A silver layer 16 is then applied over the copper layer 14 by electrolytic deposition. The copper layer 14 promotes adherence between the silver layer 16 and the nickel layer 12. The silver layer 16 is made of either pure silver or a silver alloy, pure silver being preferred. Ag-Pd and Ag-Sn are two examples of materials which exhibit sufficient solderability such that these alloys could be expected to work effectively as the silver layer 16 in embodiments of the present invention. The thickness of the silver layer 16 should be between 0.13 and 1.0 microns, preferably about 0.63 microns. One benefit of the silver layer 16 is improved solderability of the finished lead frame. The silver layer 16 is also cost effective and wire-bondable.

A palladium layer 18 is applied over the silver layer 16, by electrolytic deposition, to provide the coating surface finish. The palladium layer 18 is made of either pure palladium or a palladium alloy, such as Pd-Ni or Pd-Co. The thickness of the palladium layer 18 should be between 0.08 and 0.63 microns, preferably about 0.25 microns. The palladium layer 18 serves to protect the silver layer 16 from tarnish. Furthermore, the palladium layer 18 of the present invention imparts oxidation resistance, corrosion resistance and a cosmetically acceptable finish to the lead frame.

It has been found that the copper and silver layers 14 and 16 greatly enhance the solderability performance of the palladium layer 18. The silver layer 16 dissolves more rapidly in solder than palladium materials. The copper layer 14 improves the solderability by alloying with the solder during the soldering process. For instance, the copper layer 14 will alloy with Sn during soldering with Sn-Pb solder. The copper layer 14 is also thought to enhance wettability during the soldering process. In this way, the combination of coating materials disclosed in the present invention exhibits improved solderability over palladium and nickel coated lead frames.

Because lead frame coating materials, such as palladium, can be expensive, another benefit of the present invention is that the copper layer 14, the silver layer 16, and/or the palladium layer 18 can be selectively applied only in areas of the lead frame that are to be soldered after encapsulation. This selective application minimizes the amount of copper, silver and/or palladium which must be used.

It is to be understood that the present invention is not limited to the above described embodiments, and that various changes and modifications could be effected by one skilled in the art without departing from the spirit or scope of the invention as defined in the appended claims.

A description of some possible changes and modifications to the foregoing invention are discussed below.

Figure 2:
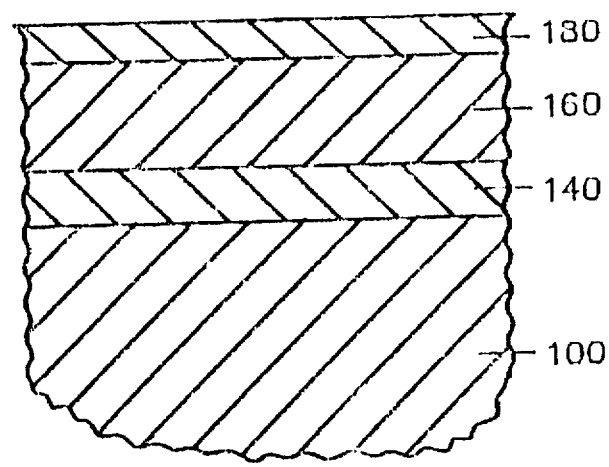
FIG. 2 is a cross-sectional view (not to scale) illustrating a fragment of a second embodiment of a lead frame according to the present invention.

While the lead frame base material is often made of copper or a copper alloy as described above, some lead frames employ ferrous, or iron-bearing alloy, base materials. If the lead frame has a ferrous base material, then it is possible to omit the nickel layer described above. Such a lead frame is shown in FIG. 2. The lead frame of FIG. 2 has a ferrous base layer 100, a copper layer 140, a silver layer 160 and a palladium layer 180. The copper layer 140, silver layer 160 and the palladium layer 180 are respectively similar to the copper layer 14, the silver layer 16 and the palladium layer 18 discussed above.

While the nickel layer 12, discussed above, may be between 1.25 microns and 1.50 microns, for some applications, the nickel layer may be thinner, down to 0.2 microns. The nickel layer 12 is generally, the least ductile of all the layers. When choosing a type of nickel or nickel alloy for the nickel layer, it is preferable to choose more ductile alternatives in order to reduce cracking in the nickel layer.

For example, cracks in the nickel layer 12 may be caused by the forming operation during plastic package assembly. The silver layer 16 and/or the copper layer can help prevent these cracks from spreading to the extent that failure or a breach in the protective coating occurs.

Alloys of nickel may be used for the nickel layer 12. Possibly suitable nickel alloys include nickel-cobalt (Ni-Co), nickel-phosphorous (Ni-P), nickel-silver (Ni-Ag) and tin-nickel (Sn-Ni).

Instead of a nickel layer 12 (see FIG. 1), a palladium alloy layer 12 may be used. Alternatives such as Pd-Sn (palladium-tin) and Pd-Co (palladium-cobalt) are possibilities for palladium alloy layer 12. The palladium alloy layer 12 must have a sufficient composition and thickness to protect the base layer 10 from oxidation and corrosion. The palladium alloy layer 12 should generally be between 0.1 and 2.5 microns in thickness, preferably toward the thinner end of this range.

The layer 12 may also be a tin-cobalt (Sn-Co) layer 12 or pure cobalt (Co) layer 12. These are alternatives are also thought to provide the base layer 10 with sufficient protection from oxidation and corrosion. From all the possible alternatives for layer 12, it is desirable to choose a material which is low in cost and relatively less susceptible to cracking.

The copper layer 14 (see FIG. 1), in addition to improving solderability and tarnish resistance of the lead frame, also helps to inhibit spreading of cracks which may occur in the less ductile nickel layer 12. While the copper layer 14 may be between 0.08 and 0.38 microns in thickness, the copper layer 14 may be as thick as 1.5 microns. Generally, as the copper layer 14 is made thicker, it will more effectively inhibit the spreading of cracks.

The silver layer 16 (see FIG. 1) also helps inhibit the spread of cracks in the less ductile nickel layer 12. Generally the thicker the aggregate thickness of the copper layer 14 and the silver layer 16, the more effectively these layers will inhibit the spreading of cracks.

Instead of a silver layer 16 (see FIG. 16), a tin layer 16 may be used. The tin layer 16 can be made of pure tin or a tin alloy, such as Sn-Pb (tin-lead). Preferably, the tin layer 16 should have a high melting point, for instance above 150° C., so that it can withstand high temperature fabrication or assembly operations. For example, possible tin alloys include tin-zinc (Sn-Zn) or tin-lead (Sn-Pb). The tin layer 16 should be chosen to be easily solderable, in order to enhance solderability of the finished lead frame. If the tin layer 16 is made of pure tin or Sn-Pb, then the tin layer 16 can be applied by electrolytic deposition. The tin layer 16 should generally be between 0.5 and 5 microns in thickness, preferably about 2 microns. When the copper layer 14 is present, the tin layer 14 should preferably be at least 0.5 microns thicker than the copper layer 14 in order to prevent copper from diffusing toward the surface of the lead frame.

Figure 3:
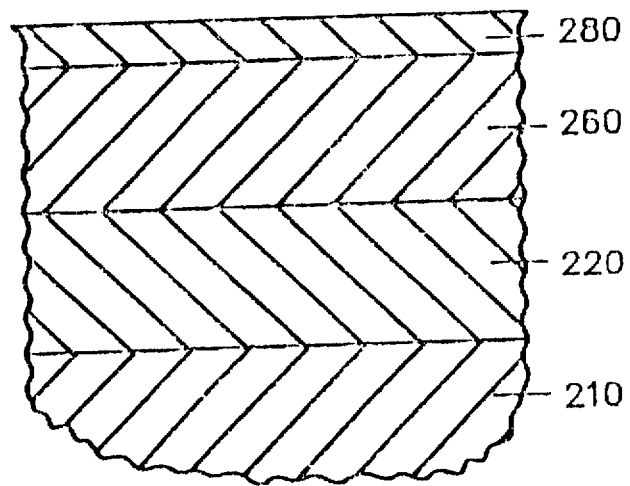
FIG. 3 is a cross-sectional view (not to scale) illustrating a fragment of a third embodiment of a lead frame according to the present invention.

When there is a tin layer (instead of a silver layer), it may be possible to omit the copper layer altogether. This is because there may be sufficient adhesion of the tin layer to the underlying nickel and sufficient solderability without the copper layer. Such a lead frame is shown in FIG. 3. The base layer 210 is coated by a nickel layer 220. The nickel layer 220 is coated by a tin layer 260. The tin layer 260 is coated by a palladium layer 280. The base layer 210, the nickel layer 220 and the palladium layer 280 are similar to corresponding layers discussed above in connection with the other embodiments.

What is claimed is:

1. A method of fabricating a protective coating for a lead frame comprising the steps of:

supplying a lead frame base consisting essentially of iron or an iron alloy;

electroplating a copper-containing layer over the lead frame base;

electroplating a silver-containing layer over the copper-containing layer; and electroplating a palladium-containing layer over the silver-containing layer.

* * * * *